United States Patent
Kushiya

(10) Patent No.: US 8,093,096 B2
(45) Date of Patent: Jan. 10, 2012

(54) METHOD OF SUCCESSIVE HIGH-RESISTANCE BUFFER LAYER/WINDOW LAYER (TRANSPARENT CONDUCTIVE FILM) FORMATION FOR CIS BASED THIN-FILM SOLAR CELL AND APPARATUS FOR SUCCESSIVE FILM FORMATION FOR PRACTICING THE METHOD OF SUCCESSIVE FILM FORMATION

(75) Inventor: Katsumi Kushiya, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 758 days.

(21) Appl. No.: 11/915,423

(22) PCT Filed: May 24, 2006

(86) PCT No.: PCT/JP2006/310371
§ 371 (c)(1), (2), (4) Date: Feb. 4, 2008

(87) PCT Pub. No.: WO2006/126598
PCT Pub. Date: Nov. 30, 2006

(65) Prior Publication Data
US 2009/0087940 A1    Apr. 2, 2009

(30) Foreign Application Priority Data
May 27, 2005   (JP) ................ P.2005-155712

(51) Int. Cl.
H01L 33/00   (2010.01)
(52) U.S. Cl. .................. 438/94; 257/E31.007
(58) Field of Classification Search ........... 257/E31.007; 438/94
See application file for complete search history.

(56) References Cited

U.S. PATENT DOCUMENTS
4,611,091 A    9/1986   Choudary et al.
4,612,411 A *  9/1986   Wieting et al. ............. 136/265
4,638,111 A *  1/1987   Gay .......................... 136/249

FOREIGN PATENT DOCUMENTS
JP    61-279181 A    12/1986
JP    1-298164 A     12/1989
(Continued)

OTHER PUBLICATIONS
Chinese Office Action dated Jan. 9, 2009.
Office Action issued in corresponding Japanese Patent Application No. 2005-155712, dated Jul. 6, 2011.
English translation of Office Action drafted Jul. 6, 2011 and mailed Jul. 11, 2011 in Japanese Patent Application No. 2005-155712.

*Primary Examiner* — David S Blum
(74) *Attorney, Agent, or Firm* — Sughrue Mion, PLLC

(57) ABSTRACT

A high-resistance buffer layer and a window layer (transparent conductive film) are successively formed by the MOCVD method to obtain the same output characteristics as in conventional film deposition by the solution deposition method and to simplify a film deposition method and apparatus. Thus, the cost of raw materials and the cost of waste treatments are reduced to attain a considerable reduction in production cost. After a metallic base electrode layer 1B and a light absorption layer 1C are formed in this order on a glass substrate 1A, a high-resistance buffer layer 1D and a window layer 1E are successively formed in this order in a multi layer arrangement on the light absorption layer 1C of the resultant semifinished solar cell substrate by the MOCVD method. Consequently, a film deposition method and apparatus are simplified and the cost of raw materials and the cost of waste treatments can be reduced.

7 Claims, 5 Drawing Sheets

FOREIGN PATENT DOCUMENTS

| | | |
|---|---|---|
| JP | 8-213328 A | 8/1996 |
| JP | 8-330614 A | 12/1996 |
| JP | 11-177112 A | 7/1999 |
| JP | 2000-261015 A | 9/2000 |

\* cited by examiner

METHOD OF SUCCESSIVE HIGH-RESISTANCE BUFFER LAYER/WINDOW LAYER (TRANSPARENT CONDUCTIVE FILM) FORMATION FOR CIS BASED THIN-FILM SOLAR CELL AND APPARATUS FOR SUCCESSIVE FILM FORMATION FOR PRACTICING THE METHOD OF SUCCESSIVE FILM FORMATION

TECHNICAL FIELD

The present invention relates to a method of successive film formation in which the high-resistance buffer layer and window layer (transparent conductive film) of a CIS based thin-film solar cell are successively formed by the MOCVD method and to an apparatus for successive film formation for carrying out the method of successive film formation.

BACKGROUND ART

CIS based thin-film solar cells were regarded as practically usable extensively. Patent document 1 among many publications discloses that to deposit a cadmium sulfide (CdS) layer as a high-resistance buffer layer on a light absorption layer comprising a thin $CuInSe_2$ film is necessary for obtaining a thin solar cell having a high conversion efficiency. There is a statement in patent document 1 to the effect that the solution deposition method described therein, in which a thin CdS film is deposited from a solution, has the following effect. The immersion of a thin $CuInSe_2$ light absorption layer in the solution not only forms a heterojunction interface but also produces the effect of etching or selectively cleaning the surface of the thin light absorption layer to thereby form a high-quality heterojunction with the thin $CuInSe_2$ light absorption layer and heighten shunt resistance. In the case where a cadmium sulfide (CdS) layer is deposited as the high-resistance buffer layer, efforts are being made to minimize the discharge of a waste liquid containing cadmium, which is highly toxic. However, solid CdS and an alkaline waste liquid are yielded in large quantities and, hence, the cost of waste treatments has been an obstacle to a reduction in solar cell production cost.

On the other hand, patent document 2 discloses a production process in which a zinc compound crystal containing oxygen, sulfur, and hydroxyl groups, i.e., $Zn(O,S,OH)_x$, chemically deposited from a solution on a p-type light absorption layer is used as a high-resistance buffer layer, whereby a thin solar cell having the same high conversion efficiency as in the case of using a CdS layer as a buffer layer can be obtained. The production process disclosed in patent document 2 is effective in eliminating the use of a CdS buffer layer, which is considered to be essential to processes for producing a thin solar cell having a high conversion efficiency. However, a solid ZnO/ZnS mixture and an alkaline waste liquid are yielded in large quantities in this case also, and the cost of waste treatments has been an obstacle to a reduction in solar cell production cost.

Patent Document 1: U.S. Pat. No. 4,611,091 (Class 136/260; issued on Sep. 9, 1986)
Patent Document 2: Japanese Patent No. 3249342 (JP-A-8-330614)

DISCLOSURE OF THE INVENTION

Problems that the Invention is to Solve

An object of the invention, which is for eliminating the problems described above, is to conduct film deposition by the MOCVD method to obtain the same output characteristics (conversion efficiency, open-circuit voltage, short-circuit current density, and fill factor) as in conventional film formation by the solution deposition method and to simplify a production process, reduce the cost of raw materials and the cost of waste treatments, and thereby attain a considerable reduction in production cost.

Means for Solving the Problems (1) The invention provides a method of successive high-resistance buffer layer/window layer (transparent conductive film) formation for a CIS based thin-film solar cell,
wherein in a process for producing a CIS based thin-film solar cell which is a pn heterojunction device having a substrate structure comprising a glass substrate, a metallic back electrode layer, a light absorption layer having p-type conductivity and comprising a CIS based ($CuInSe_2$ based) chalcopyrite multinary compound semiconductor thin film, a buffer layer comprising a zinc compound crystal semiconductor thin film having transparency and high resistance, and a window layer having n-type conductivity and comprising a zinc oxide (ZnO)-based transparent conductive film having transparency and low resistance which have been superposed in this order,
the buffer layer and the window layer are successively formed in this order in a multilayer arrangement on the light absorption layer of a semifinished solar cell substrate obtained by forming the metallic base electrode layer and the light absorption layer in this order on the glass substrate.

(2) The invention further provides the method of successive high-resistance buffer layer/window layer (transparent conductive film) formation for a CIS base thin-film solar cell as described under (1) above, wherein the buffer layer and the window layer are successively formed by the metal organic chemical vapor deposition (MOCVD) method in an MOCVD film deposition apparatus having a structure in which preheating steps and film deposition steps are connected in an in-line arrangement.

(3) The invention furthermore provides the method of successive high-resistance buffer layer/window layer (transparent conductive film) formation for a CIS based thin-film solar cell as described under (1) above, wherein the buffer layer and the window layer are successively formed in the same MOCVD film deposition apparatus in a buffer layer formation step and a window layer formation step, respectively, which are adjoining independent steps.

(4) The invention furthermore provides the method of successive high-resistance buffer layer/window layer (transparent conductive film) formation for a CIS based thin-film solar cell as described under (2) or (3) above, wherein in the steps of forming the buffer layer and the window layer, an organometallic compound of zinc and pure water are packed as film-forming raw materials into a bubbler or the like and an inert gas such as helium or argon is used as a carrier gas passing through the bubbler to conduct film deposition by the MOCVD method.

(5) The invention furthermore provides the method of successive high-resistance buffer layer/window layer (transparent conductive film) formation for a CIS based thin-film solar cell as described under (2) or (3) above, wherein in the step of forming the window layer, an organometallic compound of zinc and pure water ($H_2O$) are packed as film-forming raw materials into a bubbler or the like and an inert gas such as helium or argon is used as a carrier gas passing through the bubbler to conduct film deposition by the MOCVD method in which one or more elements in Group III of the periodic table, e.g., any one of or a combination of boron, aluminum, indium, and gallium, are used as a dopant in order to regulate resistivity.

(6) The invention furthermore provides the method of successive high-resistance buffer layer/window layer (transparent conductive film) formation for a CIS based thin-film solar cell as described under (4) or (5) above, wherein the organometallic compound of zinc is dimethylzinc or diethylzinc, desirably diethylzinc (DEZ), and this compound is packed into the bubbler and an inert gas such as helium or argon is bubbled thereinto and supplied together with the compound into the MOCVD film deposition apparatus in the step of forming the window layer.

(7) The invention furthermore provides the method of successive high-resistance buffer layer/window layer (transparent conductive film) formation for a CIS based thin-film solar cell, wherein the dopant in (5) above used for regulating resistivity is a gas or volatile (or high-vapor-pressure) liquid produced as a hydrogenated or organometallic compound, and each dopant compound is diluted with an inert gas such as helium or argon, mixed with the carrier gas to be accompanied by the raw materials, and supplied into the MOCVD film deposition apparatus in the step of forming the window layer.

(8) The invention furthermore provides the method of successive high-resistance buffer layer/window layer (transparent conductive film) formation for a CIS based thin-film solar cell as described under any one of (1) to (4) above, wherein the buffer layer is formed by heating the substrate to a temperature in the range of 100-200° C., desirably 120-160° C., in a vacuum of up to $10^{-3}$ Torr in a preheating step which is a step preceding a buffer layer formation step, conveying the substrate immediately after heating to that temperature to the buffer layer formation step kept at a temperature in the range of 120-160° C., and using diethylzinc and pure water as film-forming raw materials in the buffer layer formation step to deposit a thin ZnO film having a film thickness in the range of 2-50 nm and containing a slight amount of zinc hydroxide with a DEZ/H$_2$O molar ratio of 0.5-0.7.

(9) The invention furthermore provides the method of successive high-resistance buffer layer/window layer (transparent conductive film) formation for a CIS based thin-film solar cell as described under any one of (1) to (5) above, wherein the window layer is formed by heating the substrate to a temperature in the range of 140-250° C., desirably 160-190° C., in a vacuum of up to $10^{-3}$ Torr in a preheating step which is a step preceding a window layer formation step, conveying the substrate immediately after heating to that temperature to the window layer formation step kept at a temperature in the range of 160-190° C., using diethylzinc and pure water as film-forming raw materials in the window layer formation step, and supplying diborane gas diluted to a concentration of 1-5 vol % with an inert gas into a raw-material piping to conduct doping with boron derived from the diborane and thereby deposit a low-resistance ZnO-based transparent conductive film having a sheet resistance of 10 Ω/□ or lower, a transmittance of 85% or higher, and a film thickness in the range of 0.5-2.5 μm, desirably in the range of 1-1.5 μm.

(10) The invention furthermore provides an apparatus for successive high-resistance buffer layer/window layer (transparent conductive film) formation for a CIS based thin-film solar cell, which is for practicing the method of successive film formation as described under (1) to (3) above, wherein in producing a CIS based thin-film solar cell which is a pn heterojunction device having a substrate structure comprising a glass substrate, a metallic base electrode layer, a light absorption layer having p-type conductivity and comprising a CIS based (CuInSe$_2$ based) chalcopyrite multinary compound semiconductor thin film, a buffer layer comprising a zinc compound crystal semiconductor thin film having transparency and high resistance, and a window layer having n-type conductivity and comprising a zinc oxide (ZnO)-based transparent conductive film having transparency and low resistance which have been superposed in this order, the apparatus is for successively forming the buffer layer and the window layer in this order in a multilayer arrangement by the MOCVD method on the light absorption layer of a semifinished solar cell substrate obtained by forming the metallic base electrode layer and the light absorption layer in this order on the glass substrate, and the apparatus comprises: a substrate introduction part into which the semifinished solar cell substrate is introduced; a preheating chamber in which the semifinished solar cell substrate is preheated; a high-resistance buffer layer formation chamber in which a high-resistance buffer layer is formed on the semifinished solar cell substrate which has been preheated; a chamber for both vacuum drying and preheating in which the semifinished solar cell substrate on which the high-resistance buffer layer has been formed is dried and preheated; a window layer formation chamber in which a window layer is formed on the semifinished solar cell substrate which has been dried and preheated; a cooling chamber in which the semifinished solar cell substrate on which the buffer layer and window layer have been formed is cooled; and a substrate takeout part from which the semifinished solar cell substrate on which the buffer layer and window layer have been formed is taken out.

(11) The invention furthermore provides the apparatus for successive high-resistance buffer layer/window layer (transparent conductive film) formation for a CIS based thin-film solar cell as described under (10) above, which is for practicing the method of successive film formation as described under (4) and (8) above, wherein in the high-resistance buffer layer formation chamber, diethylzinc and pure water are packed as film-forming raw materials into a bubbler or the like and an inert gas such as helium or argon is used as a carrier gas passing through the bubbler to feed the raw materials onto the heated semifinished solar cell substrate and thereby deposit a thin ZnO film having a film thickness of 2-50 nm and containing a slight amount of zinc hydroxide with a DEZ/H$_2$O molar ratio of 0.5-0.7 by the MOCVD method.

(12) The invention furthermore provides the apparatus for successive high-resistance buffer layer/window layer (transparent conductive film) formation for a CIS based thin-film solar cell as described under (10) above, which is for practicing the method of successive film formation as described under (5) above, wherein in the window layer formation chamber, an organometallic compound of zinc and pure water are packed as film-forming raw materials into a bubbler or the like, an inert gas such as helium or argon is used as a carrier gas passing through the bubbler, and one or more elements in Group III of the periodic table, e.g., any one of or a combination of boron, aluminum, indium, and gallium, are used as a dopant in order to regulate resistivity by the method described under (7) above to deposit a ZnO-based transparent conductive film by the MOCVD method.

Advantages of the Invention

The method of the invention for film formation by the MOCVD method can attain the same output characteristics (conversion efficiency, open-circuit voltage, short-circuit current density, and fill factor) as in conventional film formation by the solution deposition method. In addition, since a high-resistance buffer layer 1D and a window layer (transparent conductive film) 1E are successively formed by the MOCVD method, production process simplification and a reduction in raw-material cost and waste treatment cost can be attained. Consequently, a considerable reduction in production cost can be attained.

BEST MODE FOR CARRYING OUT THE INVENTION

Embodiments of the invention will be explained below by reference to drawings.

The invention relates to a method of successive high-resistance buffer layer/window layer (transparent conductive film) formation for a CIS based thin-film solar cell and an apparatus for successive film formation for carrying out the method of successive film formation.

As shown in FIG. 7, the CIS based thin-film solar cell is a pn heterojunction device of a substrate structure comprising a glass substrate 1A (thickness, 1-3 μm), a metallic base electrode layer 1B (a metal such as molybdenum or titanium having a thickness of 1-2 μm), a p-type CIS light absorption layer 1C, a high-resistance buffer layer 1D, and an n-type window layer (transparent conductive film) 1E which have been superposed in this order. The light absorption layer is a thin film which has a thickness of 1-3 μm and has a Cu-III-VI$_2$ Group chalcopyrite structure having p-type conductivity. For example, it is a thin film of a multinary compound semiconductor such as CuInSe$_2$, Cu(InGa)Se$_2$, or Cu(InGa) (SSe)$_2$.

Other examples of the p-type CIS light absorption layer 1C include selenide-based CIS light absorption layers, sulfide-based CIS light absorption layers, and sulfide/selenide-based CIS light absorption layers. The selenide-based CIS light absorption layers may comprise CuInSe$_2$, Cu(InGa) Se$_2$, or CuGaSe$_2$. The sulfide-based CIS light absorption layers may comprise CuInS$_2$, Cu(InGa)S$_2$, or CuGaS$_2$. The sulfide/selenide-based CIS light absorption layers may comprise CuIn (SSe)$_2$, Cu(InGa) (SSe)$_2$, or CuGa(SSe)$_2$, and examples of ones having a surface layer include CuInSe$_2$ having CuIn (SSe)$_2$ as a surface layer, Cu(InGa)Se$_2$ having CuIn(SSe)$_2$ as a surface layer, Cu(InGa) (SSe)$_2$ having CuIn(SSe)$_2$ as a surface layer, CuGaSe$_2$ having CuIn(SSe)$_2$ as a surface layer, Cu(InGa)Se$_2$ having Cu(InGa) (SSe)$_2$ as a surface layer, CuGaSe$_2$ having Cu(InGa) (SSe)$_2$ as a surface layer, Cu(InGa)Se$_2$ having CuGa(SSe)$_2$ as a surface layer, and CuGaSe$_2$ having CuGa(SSe)$_2$ as a surface layer.

The method of successive high-resistance buffer layer/window layer (transparent conductive film) formation of the invention is explained below.

The method of successive high-resistance buffer layer/window layer (transparent conductive film) formation is a method in which a high-resistance buffer layer 1D and a window layer (transparent conductive film) 1E are successively formed by the MOCVD method on a semifinished-solar-cell-bearing substrate A (hereinafter referred to as substrate) obtained by forming a metallic base electrode layer 1B and a light absorption layer 1C in this order on a glass substrate 1A. The high-resistance buffer layer 1D has transparency and high resistance ($10^4$ Ω·cm or higher) and is an intrinsic thin zinc oxide film, while the window layer (transparent conductive film) 1E is a thin semiconductor film of zinc oxide which has a large bandgap width where n-type conductivity is exhibited and which has transparency, low resistance, and a thickness of 0.5-2.5 μm.

A method heretofore in use for forming a high-resistance buffer layer and a window layer (transparent conductive film) comprises depositing a high-resistance buffer layer 1D on the light absorption layer 1C of the substrate A by the solution deposition method in which a film is chemically deposited from a solution and thereafter depositing a window layer (transparent conductive film) 1E thereon in a separate step.

As shown in FIG. 1, in the method of the invention for film formation by the MOCVD method, the high-resistance buffer layer 1D is deposited on the light absorption layer 1C of the substrate A by the MOCVD method using diethylzinc and pure water as raw materials and a low-resistance window layer (transparent conductive film) 1E is successively deposited thereon in the same MOCVD film deposition apparatus using the same raw materials and using, as a dopant, boron derived from diborane.

Details of the method of successive high-resistance buffer layer/window layer (transparent conductive film) formation of the invention are explained below.

As shown in FIG. 1 (a), the method is a successive film formation method in which the buffer layer 1D and the window layer 1E are successively formed in this order in a multilayer arrangement on the light absorption layer 1C of the semifinished solar cell substrate A obtained by forming a metallic base electrode layer 1B and a light absorption layer 1C in this order on the glass substrate 1A.

In this method of successive film formation, the buffer layer 1D and the window layer 1E are successively formed by the metal organic chemical vapor deposition (MOCVD) method in a production process (or in an MOCVD film deposition apparatus having a structure) in which preheating steps and film deposition steps are connected in an in-line arrangement.

Furthermore, the buffer layer 1D and the window layer 1E are successively formed in the same MOCVD film deposition apparatus in a buffer layer formation step and a window layer formation step, respectively, which are adjoining independent steps.

In the steps of forming the buffer layer 1D and the window layer 1E, an organometallic compound of zinc and pure water are packed as film-forming raw materials into a bubbler or the like and an inert gas such as helium or argon is used as a carrier gas passing through the bubbler to conduct film deposition by the MOCVD method. The organometallic compound of zinc may be dimethylzinc or diethylzinc, desirably diethylzinc, and this compound is packed into the bubbler and an inert gas such as helium or argon is bubbled thereinto and supplied together with the organometallic compound to the steps of forming the buffer layer 1D and the window layer 1E (into the MOCVD film deposition apparatus). Incidentally, dimethylzinc and diethylzinc are liquid at ordinary temperature.

The buffer layer is formed by heating the substrate to a temperature in the range of 100-200° C., desirably 120-160° C., in a vacuum of up to $10^{-3}$ Torr in a preheating step which is a step preceding a buffer layer formation step, conveying the substrate immediately after heating to that temperature to the buffer layer formation step kept at a temperature in the range of 120-160° C., and using diethylzinc and pure water as film-forming raw materials in the buffer layer formation step to deposit a thin ZnO film having a film thickness in the range of 2-50 nm and containing a slight amount of zinc hydroxide with a DEZ/H$_2$O molar ratio of 0.5-0.9.

In the step of forming the window layer 1E, one or more elements in Group III of the periodic table, e.g., any one of or a combination of boron, aluminum, indium, and gallium, are further used as a dopant in order to regulate resistivity. The dopant to be used for regulating resistivity is a gas or volatile (or high-vapor-pressure) liquid produced as a hydrogenated or organometallic compound, and each dopant compound is diluted with an inert gas such as helium or argon, mixed with the carrier gas to be accompanied by the raw materials, and supplied to the step of forming the window layer (into the MOCVD film deposition apparatus).

The window layer is formed by heating the substrate to a temperature in the range of 140-250° C., desirably 160-190° C., in a vacuum of up to $10^{-3}$ Torr in a preheating step which is a step preceding a window layer formation step, conveying the substrate immediately after heating to that temperature to the window layer formation step kept at a temperature in the range of 160-190° C., using diethylzinc and pure water as film-forming raw materials in the window layer formation step, and supplying diborane gas diluted to a concentration of 1-5 vol % with an inert gas into a raw-material piping to conduct doping with boron derived from the diborane and thereby deposit a low-resistance ZnO-based transparent conductive film having a sheet resistance of 10 Ω/□ or lower, a transmittance of 85% or higher, and a film thickness in the range of 0.5-2.5 μm, desirably in the range of 1-1.5 μm.

TABLE 1

| Method of forming high-resistance buffer layer | Output characteristics | | | |
|---|---|---|---|---|
| | Conversion efficiency [%] | Open-circuit voltage [V] | Short-circuit current density [mA/cm$^2$] | Fill factor [FF] |
| MOCVC method | 13.5 | 0.568 | 35.0 | 0.678 |
| Solution deposition method 1 | 13.6 | 0.563 | 35.4 | 0.682 |
| Solution deposition method 2 | 13.6 | 0.565 | 36.2 | 0.680 |

The film deposition methods shown in Table 1 are as follows.

MOCVD method: A high-resistance buffer layer is formed by the MOCVD method after formation of pattern 2.

Solution deposition method 1: Pattern 2 is formed after formation of a high-resistance buffer layer by the solution deposition method.

Solution deposition method 2: A high-resistance buffer layer is formed by the solution deposition method after formation of pattern 2.

Table 1 is a view showing a comparison in output characteristics between a CIS based thin-film solar cell employing a high-resistance buffer layer 1D formed by the MOCVD method according to the invention and CIS based thin-film solar cells employing a high-resistance buffer layer 1D formed by the solution deposition method heretofore in use. When the film is formed by the MOCVD method according to the invention, the same output characteristics as in the case of forming the film by the conventional solution deposition method can be obtained. Incidentally, the window layers were formed by the MOCVD method under the same conditions. As a result, the following were found. The method of the invention for film formation by the MOCVD method can attain the same output characteristics (conversion efficiency, open-circuit voltage, short-circuit current density, and fill factor) as the conventional methods of film formation by the solution deposition method. In addition, since the high-resistance buffer layer 1D and the window layer (transparent conductive film) 1E are successively formed by the MOCVD method, the method of the invention is effective in simplifying the production process and can reduce the cost of raw materials for high-resistance buffer layer formation and the cost of waste treatments in the conventional solution deposition method. Consequently, a considerable reduction in production cost can be attained.

FIG. 3 is a presentation showing the relationship between II/VI Group ratio in high-resistance buffer layer formation and fill factor [FF] in CIS based thin-film solar cells employing a high-resistance buffer layer 1D formed by the MOCVD method according to the invention (substrate temperature, 160° C.; film thickness, 5 nm). It has become clear from the figure that since a fill factor [FF] of 0.6-0.7 is necessary, an optimal range of the II/VI Group ratio in high-resistance buffer layer 1D formation (e.g., DEZ/H$_2$O molar ratio) is 0.5-0.9. Incidentally, the window layers in all cases were formed by the MOCVD method under the same conditions.

FIG. 4 is a presentation showing the relationship between substrate temperature in high-resistance buffer layer formation and fill factor [FF] in CIS based thin-film solar cells employing a high-resistance buffer layer 1D formed by the MOCVD method according to the invention (film thickness, 5 nm; II/VI Group ratio (e.g., DEZ/H$_2$O ratio=0.6). It has become clear from the figure that since a fill factor [FF] of 0.6-0.7 is necessary, an optimal range of the substrate temperature [° C.] during the formation of the high-resistance buffer layer 1D is 100° C.-250° C., desirably 150° C.-220° C. Incidentally, the window layers in all cases were formed by the MOCVD method under the same conditions.

FIG. 5 is a presentation showing the relationship between film thickness in high-resistance buffer layer formation and fill factor [FF] in CIS based thin-film solar cells employing a high-resistance buffer layer 1D formed by the MOCVD method according to the invention (substrate temperature, 160° C.; II/VI Group ratio (e.g., DEZ/H$_2$O ratio=0.6). It has become clear from the figure that for attaining a fill factor [FF] of 0.6-0.7, an optimal range of the film thickness [nm] of the high-resistance buffer layer 1D is from 2 nm to 50 nm. Incidentally, the window layers in all cases were formed by the MOCVD method under the same conditions.

FIG. 6 is a presentation showing the relationship between film thickness in high-resistance buffer layer formation and conversion efficiency in CIS based thin-film solar cells employing a high-resistance buffer layer 1D formed by the MOCVD method according to the invention (substrate temperature, 160° C.; II/VI Group ratio (e.g., DEZ/H$_2$O ratio=0.6). A conversion efficiency of 11% or higher is necessary. It has become clear from these that an optimal range of the thickness of the high-resistance buffer layer 1D is from 2 nm to 50 nm. Incidentally, the window layers in all cases were formed by the MOCVD method under the same conditions.

In the case where the method of the invention for successive high-resistance buffer layer/window layer (transparent conductive film) formation for a CIS based thin-film solar cell is applied to a CIS based thin-film solar cell of the integrated type, it is necessary to conduct a pattern formation step after each of the formation of the metallic base electrode layer, formation of the light absorption layer, formation of the high-resistance buffer layer, or formation of the window layer (transparent conductive film).

The apparatus of the invention for successive high-resistance buffer layer/window layer (transparent conductive film) formation for a CIS based thin-film solar cell is explained below.

The apparatus 2 for successive high-resistance buffer layer/window layer (transparent conductive film) formation is an apparatus for successively forming a high-resistance buffer layer and a window layer (transparent conductive film) by the MOCVD method on a semifinished solar cell substrate (hereinafter referred to as substrate) obtained by forming a metallic base electrode layer 1B and a light absorption layer 1C in this order on a glass substrate 1A. As shown in FIG. 2, it comprises: a substrate introduction part 3 into which the semifinished solar cell substrate is introduced; a preheating chamber 4 in which the semifinished solar cell substrate is preheated; a high-resistance buffer layer formation chamber 5 in which a high-resistance buffer layer is formed on the semifinished solar cell substrate which has been preheated; a chamber 6 for both vacuum drying and preheating in which the semifinished solar cell substrate on which the high-resistance buffer layer has been formed is dried and preheated; a window layer formation chamber 7 in which a window layer is formed on the semifinished solar cell substrate which has been dried and preheated; a cooling chamber 8 in which the semifinished solar cell substrate on which the buffer layer and window layer have been formed is cooled; and a substrate takeout part 9 from which the semifinished solar cell substrate on which the buffer layer and window layer have been formed is taken out.

First, a semifinished solar cell substrate A (hereinafter referred to as substrate A) obtained by forming a metallic base electrode layer 1B and a light absorption layer 1C in this order on a glass substrate 1A is introduced, in the state of being placed on a hot plate HP, into the substrate introduction part 3. The substrate A is then sent into the preheating chamber 4 and preheated to a given temperature with a heater H. Subsequently, the substrate A is sent into the high-resistance buffer layer formation chamber 5, in which a high-resistance buffer layer 1D is formed by the MOCVD method. This substrate A is then sent into the chamber 6 for both vacuum drying and preheating and is vacuum-dried and preheated. Subsequently, the substrate A is sent into the window layer formation chamber 7, in which a window layer (transparent conductive film) 1E is formed in a given thickness by the MOCVD method. This substrate A is then sent into the cooling chamber 8 and cooled. Subsequently, the substrate A is sent into the substrate takeout part 9 and taken out of the hot plate HP. Thus, a CIS based thin-film solar cell is formed which comprises a glass substrate 1A and, formed thereon in the following order, a metallic base electrode layer 1B, light absorption layer 1C, high-resistance buffer layer 1D, and window layer (transparent conductive film) 1E.

Details of constituent parts of the apparatus 2 for successive high-resistance buffer layer/window layer (transparent conductive film) formation are explained below.

The high-resistance buffer layer 1D is formed in the following manner. In the preheating chamber 4, which is the chamber preceding the buffer layer formation chamber 5, the substrate A is heated to a temperature in the range of 100-200° C., desirably 120-160° C., in a vacuum of up to $10^{-3}$ Torr obtained with a vacuum pump equipped with a mechanical booster. Immediately after heating to that temperature, the substrate A is conveyed to the buffer layer formation chamber 5 kept at a temperature in the range of 120-160° C. In this chamber, diethylzinc and pure water are used as film-forming raw materials to deposit a thin ZnO film having a thickness of 2-50 nm and containing a slight amount of zinc hydroxide with a DEZ/H$_2$O molar ratio of 0.5-0.9.

The window layer 1E is formed in the following manner. In the vacuum drying/preheating chamber 6, which is the chamber preceding the window layer formation chamber 7, the substrate is heated to a temperature in the range of 140-250° C., desirably 160-190° C., in a vacuum of up to $10^{-3}$ Torr obtained with a vacuum pump equipped with a mechanical booster. Immediately after heating to that temperature, the substrate is conveyed to the window layer formation chamber 7 kept at a temperature in the range of 160-190° C. In the window layer formation chamber 7, diethylzinc and pure water are used as film-forming raw materials and diborane gas diluted to a concentration of 1-5 vol % with an inert gas is supplied into a raw-material piping to conduct doping with boron derived from the diborane and thereby deposit a ZnO-based transparent conductive film having a sheet resistance of 10 Ω/□ or lower, a transmittance of 85% or higher, and a film thickness in the range of 0.5-2.5 μm, desirably in the range of 1-1.5 μm. The window layer (transparent conductive film) 1E is a thin semiconductor film of zinc oxide which has a large bandgap width where the film has n-type conductivity and which has transparency, low resistance, and a thickness of 0.5-3 μm.

DESCRIPTION OF REFERENCE NUMERALS AND SIGNS

Figure 1:
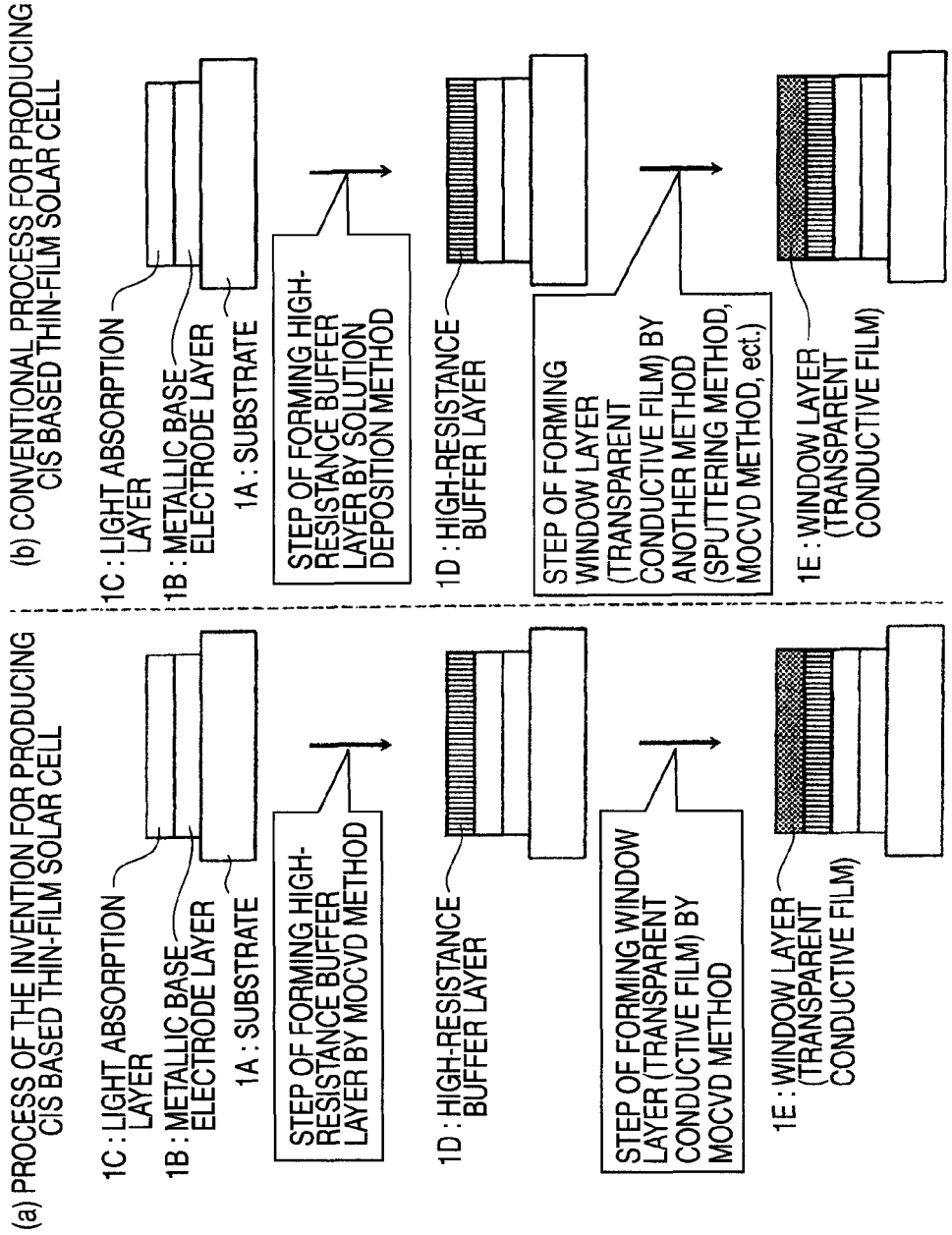
FIG. 1 is a diagrammatic view illustrating the constitution of a method of successive high-resistance buffer layer/window layer (transparent conductive film) formation of the invention.
Figure 2:
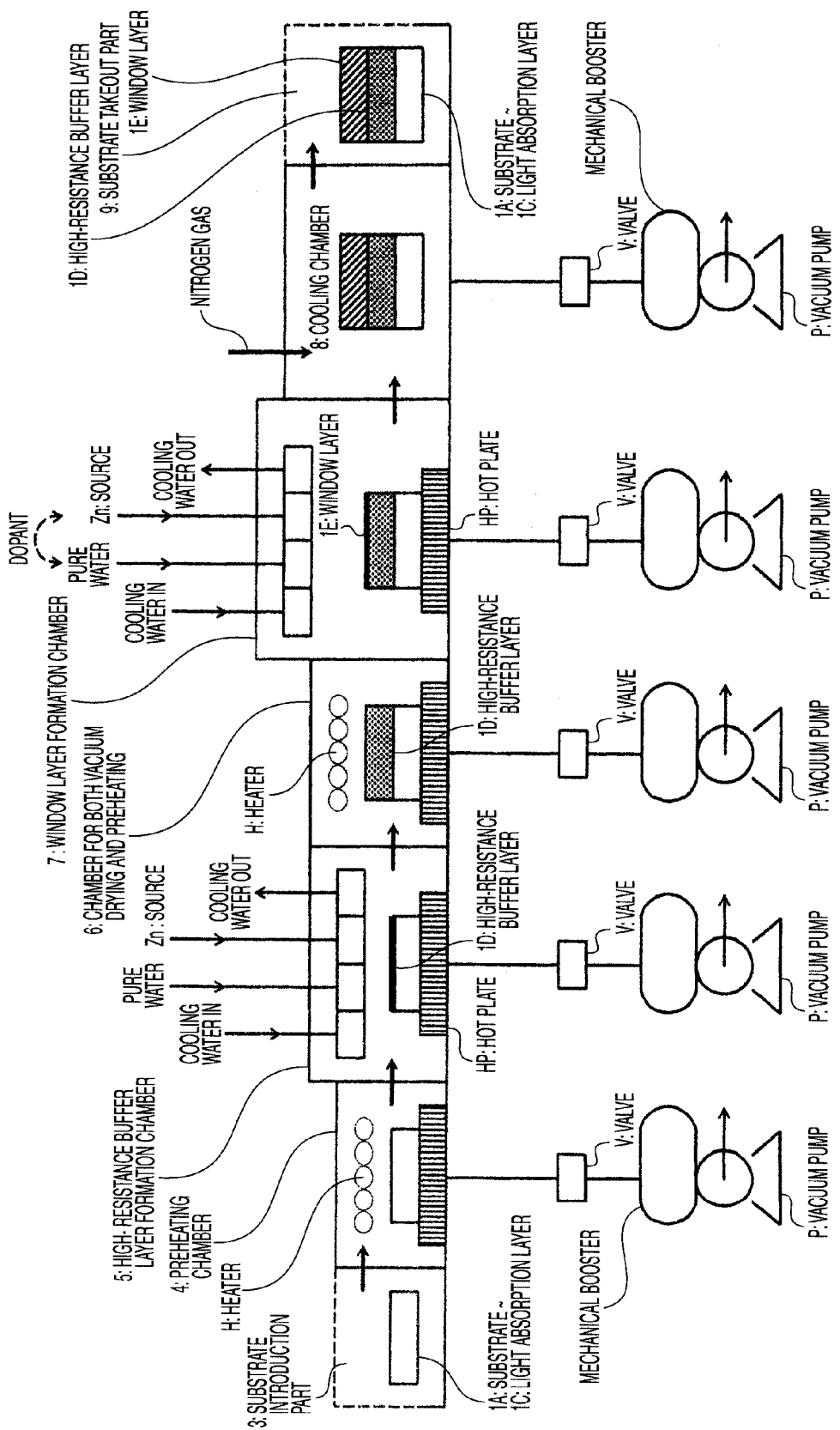
FIG. 2 is a diagrammatic view illustrating the constitution of an apparatus for successive high-resistance buffer layer/window layer (transparent conductive film) formation of the invention.
Figure 3:
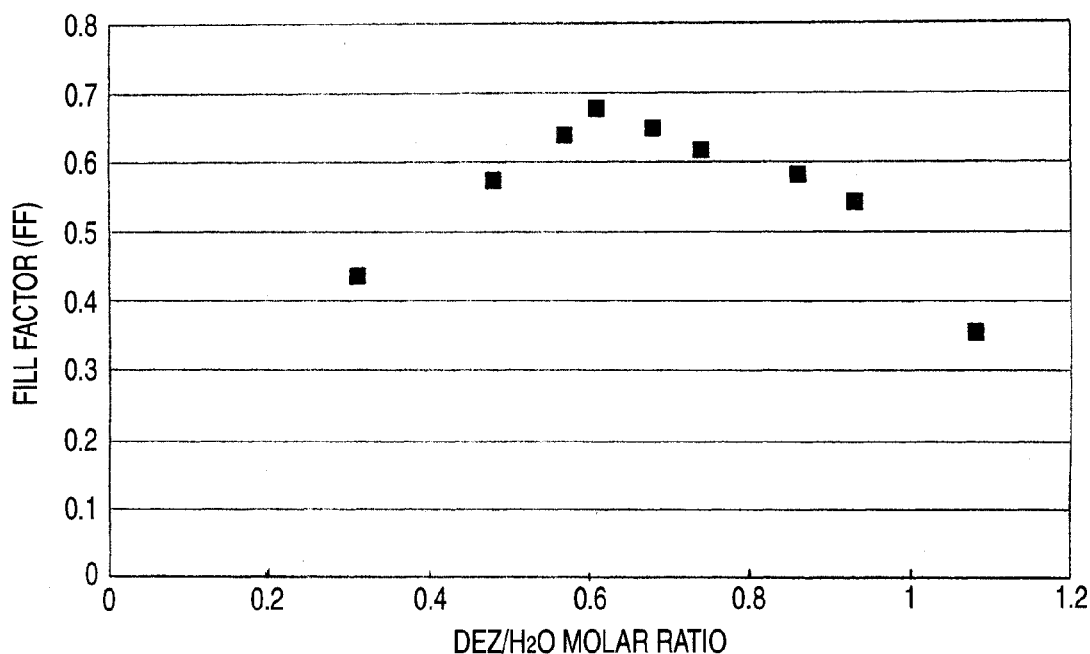
FIG. 3 is a presentation showing the relationship between II/VI Group ratio in high-resistance buffer layer formation and fill factor [FF] in CIS based thin-film solar cells employing a high-resistance buffer layer 1D formed by the MOCVD method according to the invention (substrate temperature, 160° C.; film thickness, 5 nm).
Figure 4:
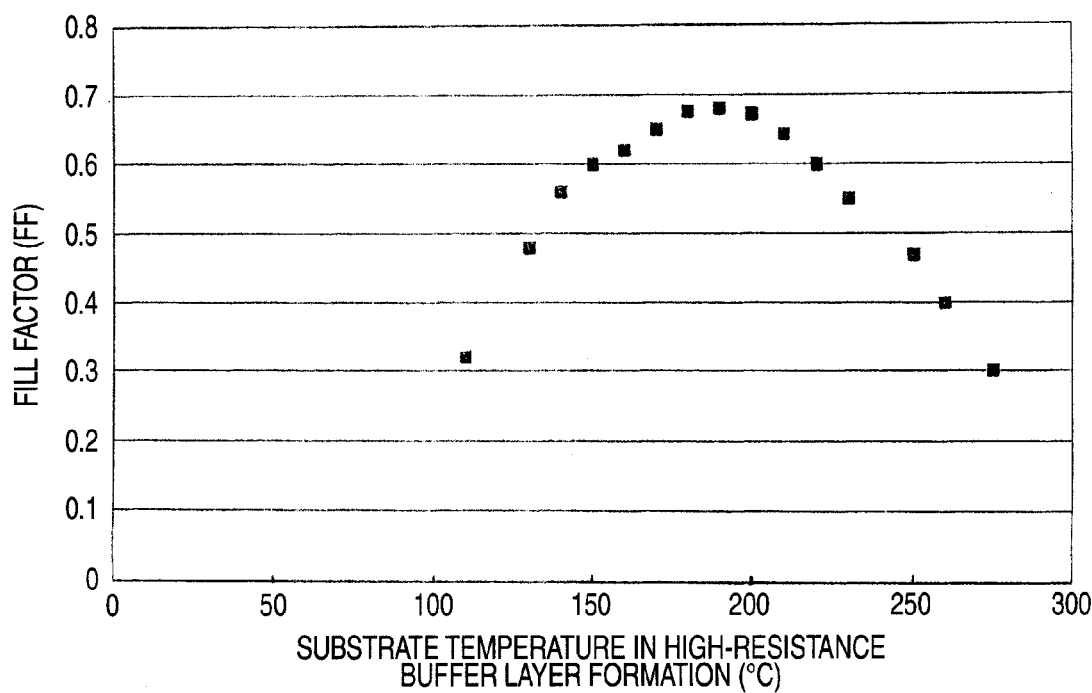
FIG. 4 is a presentation showing the relationship between substrate temperature in high-resistance buffer layer formation and fill factor [FF] in CIS based thin-film solar cells employing a high-resistance buffer layer 1D formed by the MOCVD method according to the invention (film thickness, 5 nm; II/VI Group ratio (e.g., DEZ/H$_2$O molar ratio)=0.6).
Figure 5:
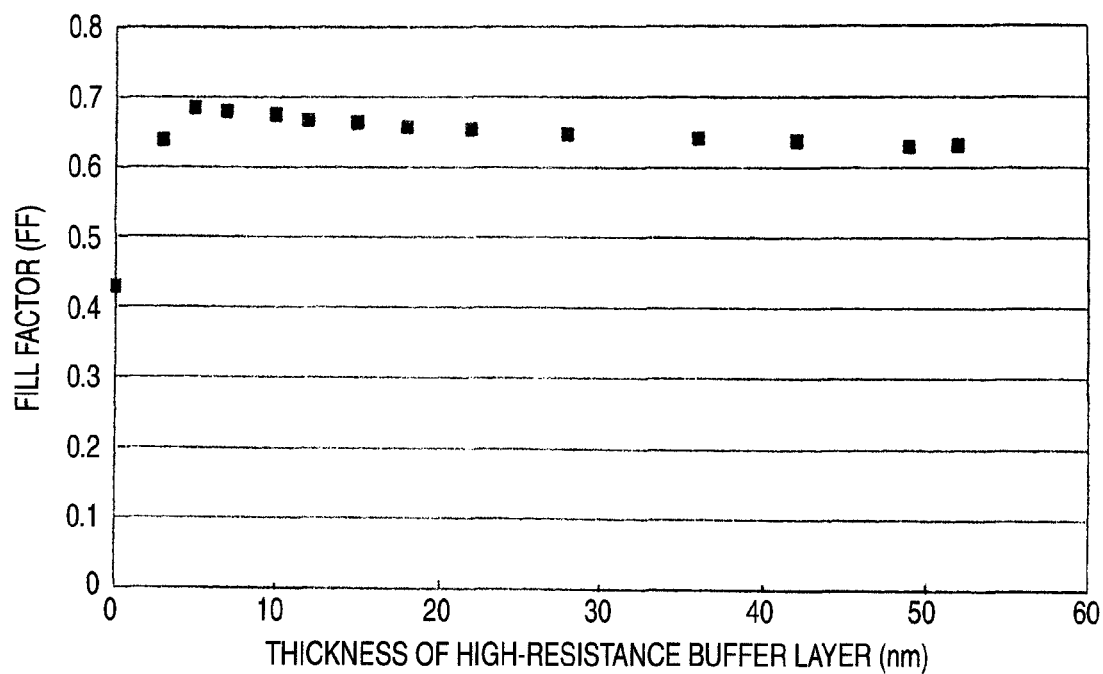
FIG. 5 is a presentation showing the relationship between film thickness in high-resistance buffer layer formation and fill factor [FF] in CIS based thin-film solar cells employing a high-resistance buffer layer 1D formed by the MOCVD method according to the invention (substrate temperature, 160° C.; II/VI Group ratio (e.g., DEZ/H$_2$O molar ratio)=0.6).
Figure 6:
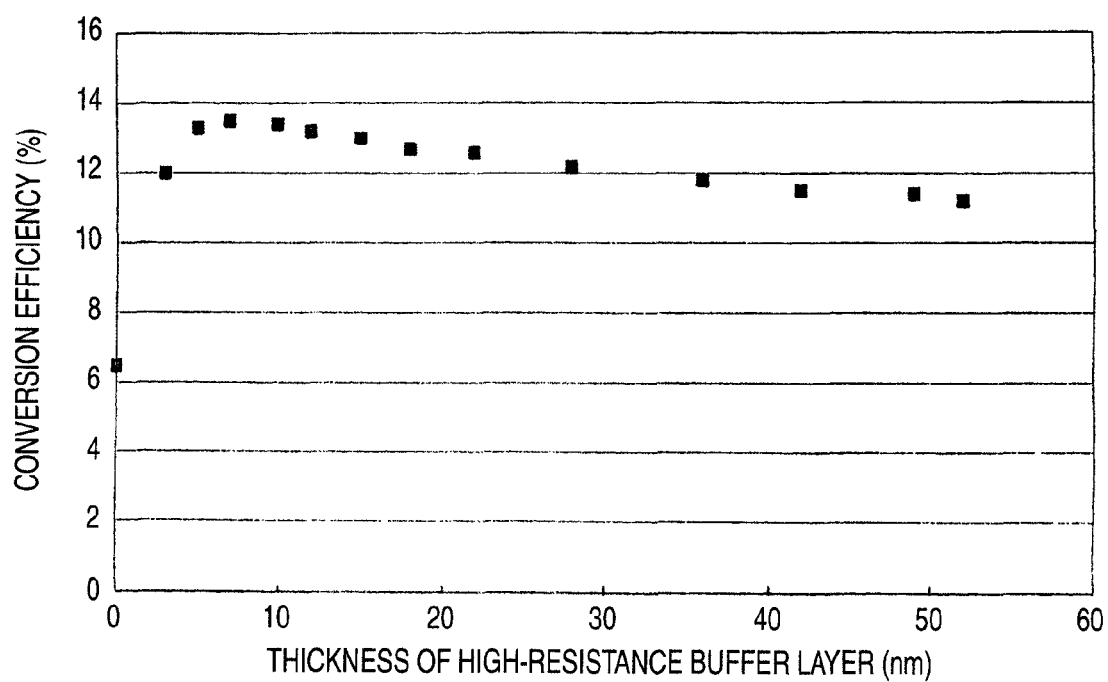
FIG. 6 is a presentation showing the relationship between film thickness in high-resistance buffer layer formation and conversion efficiency in CIS based thin-film solar cells employing a high-resistance buffer layer 1D formed by the MOCVD method according to the invention (substrate temperature, 160° C.; II/VI Group ratio (e.g., DEZ/H$_2$O molar ratio)=0.6).
Figure 7:
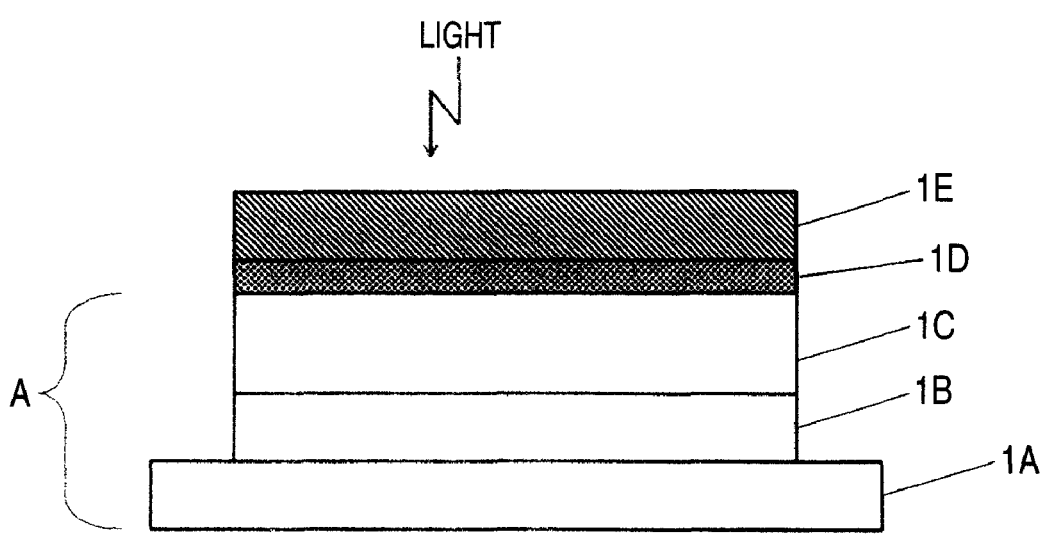
FIG. 7 is a view illustrating the constitution of a CIS type thin-film solar cell according to the invention.

1 CIS based thin-film solar cell
1A glass substrate
1B metallic base electrode layer
1C light absorption layer
1D high-resistance buffer layer
1E window layer (transparent conductive film)
A semifinished solar cell (two-layer-bearing substrate)

2 apparatus for successive high-resistance buffer layer/window layer (transparent conductive film) formation
3 substrate introduction part
4 preheating chamber
5 high-resistance buffer layer formation chamber
6 chamber for both vacuum drying and preheating
7 window layer formation chamber
8 cooling chamber
9 substrate takeout part
H heater
HP hot plate
P vacuum pump
V valve

The invention claimed is:

1. A method of successive high-resistance buffer layer/window layer (transparent conductive film) formation for a CIS based thin-film solar cell,
wherein in a process for producing a CIS based thin-film solar cell which is a pn heterojunction device having a substrate structure comprising a glass substrate, a metallic back electrode layer, a light absorption layer having p-type conductivity and comprising a CIS based ($CuInSe_2$ based) chalcopyrite multinary compound semiconductor thin film, a buffer layer comprising a zinc compound crystal semiconductor thin film having transparency and high resistance, and a window layer having n-type conductivity and comprising a zinc oxide (ZnO)-based transparent conductive film having transparency and low resistance which have been superposed in this order,
the buffer layer and the window layer are successively formed in this order in a multilayer arrangement on the light absorption layer of a semifinished solar cell substrate obtained by forming the metallic base electrode layer and the light absorption layer in this order on the glass substrate,
the buffer layer and the window layer are successively formed by the metal organic chemical vapor deposition (MOCVD) method in an MOCVD film deposition apparatus having a structure in which preheating steps and film deposition steps are connected in an in-line arrangement, and
the buffer layer and the window layer are successively formed in the same MOCVD film deposition apparatus in a buffer layer formation step and a window layer formation step, respectively, which are adjoining independent steps in different chambers.

2. The method of successive high-resistance buffer layer/window layer (transparent conductive film) formation for a CIS based thin-film solar cell according to claim 1, wherein in the steps of forming the buffer layer and the window layer, an organometallic compound of zinc and pure water are packed as film-forming raw materials into a bubbler and an inert gas of helium or argon is used as a carrier gas passing through the bubbler to conduct film deposition by the MOCVD method.

3. The method of successive high-resistance buffer layer/window layer (transparent conductive film) formation for a CIS based thin-film solar cell according to claim 1, wherein in the step of forming the window layer, an organometallic compound of zinc and pure water ($H_2O$) are packed as film-forming raw materials into a bubbler and an inert gas of helium or argon is used as a carrier gas passing through the bubbler to conduct film deposition by the MOCVD method in which any one of or a combination of boron, aluminum, indium, and gallium, are used as a dopant in order to regulate resistivity.

4. The method of successive high-resistance buffer layer/window layer (transparent conductive film) formation for a CIS based thin-film solar cell according to claim 2, wherein the organometallic compound of zinc is dimethylzinc or diethylzinc (DEZ), and this compound is packed into the bubbler and an inert gas of helium or argon is bubbled thereinto and supplied together with the compound into the MOCVD film deposition apparatus in the step of forming the window layer.

5. The method of successive high-resistance buffer layer/window layer (transparent conductive film) formation for a CIS based thin-film solar cell according to claim 3, wherein the dopant used for regulating resistivity is a gas or volatile (or high-vapor-pressure) liquid produced as a hydrogenated or organometallic compound, and each dopant compound is diluted with an inert gas of helium or argon, mixed with the carrier gas to be accompanied by the raw materials, and supplied into the MOCVD film deposition apparatus in the step of forming the window layer.

6. The method of successive high-resistance buffer layer/window layer (transparent conductive film) formation for a CIS based thin-film solar cell according to claim 1, wherein the buffer layer is formed by heating the substrate to a temperature in the range of 100-200° C., in a vacuum of up to $10^{-3}$ Torr in a preheating step which is a step preceding a buffer layer formation step, conveying the substrate immediately after heating to that temperature to the buffer layer formation step kept at a temperature in the range of 120-160° C., and using diethylzinc and pure water as film-forming raw materials in the buffer layer formation step to deposit a thin ZnO film having a film thickness in the range of 2-50nm and containing a slight amount of zinc hydroxide with a DEZ/$H_2O$ molar ratio of 0.5-0.9.

7. The method of successive high-resistance buffer layer/window layer (transparent conductive film) formation for a CIS based thin-film solar cell according to claim 1, wherein the window layer is formed by heating the substrate to a temperature in the range of 140-250° C., in a vacuum of up to $10^{-3}$ Torr in a preheating step which is a step preceding a window layer formation step, conveying the substrate immediately after heating to that temperature to the window layer formation step kept at a temperature in the range of 160-190° C., using diethylzinc and pure water as film-forming raw materials in the window layer formation step, and supplying diborane gas diluted to a concentration of 1-5 vol% with an inert gas into a raw-material piping to conduct doping with boron derived from the diborane and thereby deposit a low-resistance ZnO-based transparent conductive film having a sheet resistance of 10 Ω/□ or lower, a transmittance of 85% or higher, and a film thickness in the range of 0.5-2.5 μm.

* * * * *